(12) United States Patent
Irie et al.

(10) Patent No.: US 6,606,435 B1
(45) Date of Patent: Aug. 12, 2003

(54) LASER DIODE MODULE AND ITS MANUFACTURE METHOD

(75) Inventors: Yuichiro Irie, Tokyo (JP); Jun Miyokawa, Tokyo (JP); Takeo Shimizu, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/600,199

(22) PCT Filed: Nov. 11, 1999

(86) PCT No.: PCT/JP99/06288

§ 371 (c)(1),
(2), (4) Date: Aug. 21, 2000

(87) PCT Pub. No.: WO00/29890

PCT Pub. Date: May 25, 2000

(30) Foreign Application Priority Data

Nov. 13, 1998 (JP) ............................................. 10-341145

(51) Int. Cl.[7] .............................. G02B 6/26; G02B 6/42
(52) U.S. Cl. ............................................ 385/52; 385/91
(58) Field of Search ...................... 250/277.11; 141/392; 385/52, 88, 89, 90, 91, 92

(56) References Cited

U.S. PATENT DOCUMENTS

| | | | |
|---|---|---|---|
| 4,837,768 A | | 6/1989 | Schmid |
| 5,247,530 A | * | 9/1993 | Shigeno et al. ............... 372/36 |
| 5,570,444 A | * | 10/1996 | Janssen et al. ................ 385/90 |
| 5,619,609 A | | 4/1997 | Pan et al. |
| 6,061,374 A | * | 5/2000 | Nigtingale et al. ........... 372/43 |

FOREIGN PATENT DOCUMENTS

| | | | |
|---|---|---|---|
| DE | 43 07 974 C1 | 8/1994 | |
| EP | 0 100 086 A2 | 2/1984 | |
| EP | 0 717 297 A2 | 6/1996 | |
| JP | 2-284106 | 11/1990 | ............ G02B/6/42 |
| JP | 11-160581 | 6/1999 | ............ G02B/6/42 |

* cited by examiner

Primary Examiner—Mark A. Robinson
Assistant Examiner—Alessandro V. Amari
(74) Attorney, Agent, or Firm—Lacasse & Associates, LLC

(57) ABSTRACT

The present invention is related to a laser diode module and a fabricating method therefor, which facilitate the fabrication and enable fabrication in a short time with a low cost and high long-range reliability. With a lens formed fiber (8) and a laser diode element (LD element) (3) aligned with each other, the front side edge portion of the ferule 4 near the LD element 3 are fixedly sandwiched on the both sides thereof by means of a ferule supporting part (6) to form a sandwiched portion (9). By a fulcrum at sandwiched portion (9), the rear side edge portion of the ferule (4) is displaced to re-align the lens formed fiber (8) with the LD element (3). On the both sides for sandwiching the rear edge side of the ferule (4), ferule fixing parts (10) guided by means of a guide portion (11) with a spacing interposed against the ferule (4) are disposed with a spacing within a range of approximately 0 to 5 μm relative to a side surface of the ferule (4). After the ferule fixing parts (10) have been secured to the guide portion (11), the ferule 4 is fixedly YAG-welded to the ferule fixing parts (10).

4 Claims, 3 Drawing Sheets

(a)

(b)

(c)

LASER DIODE MODULE AND ITS MANUFACTURE METHOD

FIELD OF THE INVENTION

The present invention relates to a laser diode module for use in optical communications and a method for fabricating the same.

PRIOR ART

Conventionally, laser diode modules have been used in optical communications, in which a laser diode element (a semiconductor laser element) and an optical fiber for allowing the light from the laser diode element to propagate therethrough are optically coupled in a module. An example of such laser diode modules is disclosed in the European Patent Application EP 0 717297 A2. One that is disclosed therein is a laser diode module shown in FIG. 3. For example, as shown in FIG. 3(c), the laser diode module has a metallic base 1 and a laser diode element 3 that is fixedly disposed on a element mount block 2 secured to the upper side of the base 1.

A lens formed fiber 8 is provided as opposed to the laser diode element 3. The lens formed fiber 8 has a lens (not shown in the figure) formed on the distal end of the optical fiber for receiving laser beams from the laser diode element 3. The lens formed fiber 8 is secured to the ferrule 4 with the distal end thereof, on which the lens is provided, protruded through the distal end of a ferrule 4 toward the laser diode element 3.

Moreover, with the lens formed fiber 8 and the laser diode element 3 aligned with each other, the front side edge portions of the ferrule 4 near the laser diode element 3 are fixedly sandwiched on the both sides thereof by means of a ferrule front fixing part 15. On the other hand, the rear side edge portions of the ferrule 4 furthest from the laser diode element 3 are fixed to the base 1 via a rear fixing part 16. Furthermore, the ferrule 4 is formed in a cylindrical shape or in a shape having a U-shaped groove (in FIG. 3, a cylindrically shaped one is shown).

The aforementioned ferrule front fixing part 15 is disposed, with the part 15 guided by means of a guide portion 11, spaced approximately 0 to 5 $\mu$m to a side surface of the ferrule 4 at both sides (on the sides of both side portions) of the ferrule 4 and is fixed to the guide portion 11. After the part 15 has been fixed to the guide portion 11, the ferrule 4 is fixedly YAG-welded to the ferrule front fixing part 15, thus a sandwiched portion 9 is formed.

Furthermore, in such a laser diode module, the lens formed at the distal end of the lens formed fiber 8 is machined to obtain a high optical coupling efficiency with the laser diode element 3. However, the tolerance for optical fiber dislocation in optical coupling is extremely small. For this reason, it is inevitably necessary to fixedly align the aforementioned lens formed fiber 8 with the laser diode element 3 with an extremely high accuracy. This requires much higher accuracy compared with a case where one or more minute optical lenses such as spherical and aspherical lenses are disposed in between the edge surface of an ordinary optical fiber with no lens attached thereto and the laser diode element 3 to align the laser diode element 3 with the lens and the optical fiber.

When the aforementioned laser diode module is fabricated, the lens formed fiber 8 is aligned to obtain maximum coupling efficiency with laser diode 3. Thereafter, as shown in FIG. 3(a), the ferrule front fixing part 15 is disposed at the both sides (at the surfaces of the both sides) of the front side (the side near the laser diode element 3) of the ferrule 4 in between the ferrule 4 and the guide portion 11, which are provided with a spacing therebetween. Furthermore, the guide portion 11 is fixedly provided on the base 1 or formed in one piece with the base 1. Then, the ferrule front fixing part 15 is adapted to be guided by means of the guide portion 11 so as to be able to slide on the surface of the base 1 in the direction (toward X direction in the figure) substantially orthogonal to the beam axis of the ferrule 4. Here, the spacing between the ferrule front fixing part 15 and a side surface of the ferrule 4 is adjusted to within the range of approximately 0 to 5 $\mu$m.

Thereafter, as shown in FIG. 3(b), after the ferrule front fixing part 15 is fixedly welded to the guide portion 11 at a plurality of welded portions 7, the ferrule front fixing part 15 and the ferrule 4 are fixedly YAG-welded. The lens formed fiber 8 is dislocated to the laser diode 3 by this YAG-welding. This fixed position is the sandwiched portion 9 of the ferrule 4. After that, for example as shown in FIG. 4, the edge of the rear side of the ferrule 4 (the side furthest from the laser diode element 3) is moved for alignment by a fulcrum at the sandwiched portion 9. Thus, the laser diode element 3 and the lens formed fiber 8 are re-aligned. Furthermore, in FIG. 4, reference number 5 shows a lens provided on the fiber.

Then, under the state of the aforementioned re-alignment, the rear fixing part 16 is disposed on the edge portion of the rear side of the ferrule 4 as shown in FIG. 3(c). After the rear fixing part 16 has been secured to the base 1, the ferrule 4 is fixedly YAG-welded to the rear fixing part 16. Then, finally, the rear fixing part 16 is permanently deformed by a fulcrum at the sandwiched portion 9 in order to correct a dislocation occurring when the ferrule 4 is fixed to the rear fixing part 16. Thus, final alignment is thereby carried out and the plastic deformation of the rear fixing part 16 allows for sustaining the ferrule 4 in a state of re-alignment.

Furthermore, in the aforementioned laser diode module, the ferrule 4 is fixedly YAG-welded at the front side edge portion of the ferrule 4 after the alignment of the laser diode element 3 with the lens formed fiber 8. However, a certain degree of dislocation will occur upon fixing the ferrule 4 at any cost. Accordingly, in the laser diode module shown in FIG. 3, when the front side edge portion of the ferrule 4 is fixed according to the aforementioned method, this dislocation is reduced as follows. That is, the spacing between a side portion of the ferrule 4 and the ferrule front fixing part 15 is adjusted to within a range of approximately 0 to 5 $\mu$m, and thereafter the side portion of the ferrule 4 and the ferrule front fixing part 15 are fixedly welded to each other. This will reduce the displacement of the ferrule at the time of YAG welding between the ferrule front fixing part 15 and the ferrule 4, thus reducing a dislocation when the front side edge portion of the ferrule 4 is fixed.

Subsequently, the lens formed fiber 8 is re-aligned with the laser diode element 3. The reduction in dislocation is also intended to reduce re-alignment displacement of the rear side edge portion of the ferrule 4 by a fulcrum at the fixed portion (the sandwiched portion 9) at this time.

However, in the aforementioned laser diode module, the ferrule 4 is fixedly welded at a re-aligned position using the aforementioned rear fixing part 16 that is fixedly welded to the base 1. This makes it impossible to accurately secure the ferrule 4 at said re-alignment position since, for example, the position of the rear fixing part 16 to which the ferrule 4 is to be fixed becomes misaligned when the rear fixing part 16 is fixedly welded to the base 1. Accordingly, in the fabricating method of laser diode modules, it was necessary to perform final alignment of correcting a dislocation between the re-alignment position and the fixing position of the ferrule 4 with plastic deformation of the rear fixing part 16.

Furthermore, the rear fixing part 16 had to take a complicated shape as shown in FIG. 3(c) with additional cost in order to facilitate the final alignment between the laser diode element 3 and the lens formed fiber 8 by means of the plastic deformation. Consequently, this presented such a problem in that the laser diode module comprising such rear fixing part 16 was provided with an increase in cost.

Furthermore, the deformation of the rear fixing part 16 involved in the final alignment needs to be carried out in expectation of recovery from the deformation due to elastic deformation until the rear fixing part 16 reaches plastic deformation. This presented also another problem in that the final alignment was time consuming and thus the laser diode module was not easily fabricated.

Still furthermore, the displacement of the rear fixing part 16 required upon final alignment relates to distance a from the distal end of a lens 5 to the sandwiched portion 9 that serves as a fulcrum upon re-alignment and distance b from the sandwiched portion 9 to the rear fixing part 16. For example, if a: b is equal to 1:10, then the displacement of the rear side edge portion of the ferrule is ten times as much as a minute displacement of the distal end of the lens 5 and thus the rear fixing part 16 must be deformed by that amount. In addition, as mentioned above, an additional deformation is required to compensate the recovery resulting from elastic deformation. This causes the amount of deformation of the rear fixing part 16 to become naturally larger. Consequently, a strain is prone to develop at the sandwiched portion 9 due to twisting stress, and cracks become prone to develop at the welded portion of the sandwiched portion 9 after some time of use of the laser diode module. This presented such a problem in that the crack caused the characteristics of the laser diode module to deteriorate, reducing the reliability thereof.

The present invention was developed to solve the aforementioned prior art themes. Its object is to provide a laser diode module and a fabricating method therefor that facilitates fabrication to allow for fabricating the same in a short time at a low cost, providing high reliability.

DISCLOSURE OF THE INVENTION

In order to achieve the aforementioned object, the present invention has the following characteristic configurations. A first configuration of the laser diode module of the present invention is characterized in that a laser diode element is fixedly disposed on a fixing portion on a base; with a lens, formed at a distal end of a lens formed fiber, disposed opposite to said laser diode element, the lens formed fiber is fixedly disposed on a ferrule; the distal end side of the lens formed fiber where said lens is formed protrudes through the distal end of the ferrule; with said lens formed fiber and said laser diode element aligned with each other, the front side edge portion of the ferrule on the side near said laser diode element and the rear side edge portion of the ferrule on the side furthest from said laser diode element are fixedly sandwiched on the both sides by means of a fixing part, respectively; the fixing part for fixing said rear side edge portion of the ferrule comprises a pair of ferrule fixing parts; the pair of ferrule fixing parts are secured to the base directly or indirectly with the ferrule fixing parts sandwiching the ferrule on the both sides thereof; and said ferrule fixing parts and the ferrule are fixedly YAG-welded.

Furthermore, a second configuration of the laser diode module of the present invention is characterized in that, in said laser diode module comprising the first configuration, a guide portion is fixed on the base of the rear side edge portion of the ferrule, with a spacing provided on the both sides of the ferrule against said ferrule; and the pair of ferrule fixing parts guided by each guide portion are disposed on the both sides of the ferrule and fixed to said guide portion.

Furthermore, a third configuration of the laser diode module of the present invention is characterized in that, in said laser diode module comprising the first or the second configuration, the pair of ferrule fixing parts for fixing the rear side edge portion of the ferrule are disposed with a spacing within a range of approximately 0 to 5 $\mu$m against a side surface of the ferrule; and the ferrule and the ferrule fixing parts are fixedly YAG-welded at a position where the spacing within a range of approximately 0 to 5 $\mu$m is sustained.

Still furthermore, a fourth configuration of the laser diode module of the present invention is characterized in that, in said laser diode module comprising the third configuration, a sandwiched portion of the fixing part for fixedly sandwiching the front side edge portion of the ferrule is disposed with a spacing within a range of approximately 0 to 20 $\mu$m against a side surface of the ferrule; and the ferrule and the sandwiching portion of the fixing part are fixedly YAG-welded at a position where the spacing within a range of approximately 0 to 20 $\mu$m is sustained.

Still furthermore, the method for fabricating the laser diode module of the present invention is a method for fabricating a laser diode module having any one of the first through the fourth configurations of the laser diode module of the present invention, comprising the steps of: at a position where a laser diode element and a lens formed fiber are aligned with each other, by sandwiching the both sides of the front side edge portion of the ferrule on the side near said laser diode element with the sandwiching portion of the ferrule supporting part, fixing said sandwiching portion and said ferrule, and fixing said ferrule fixing parts and the base; thereafter, re-aligning said lens formed fiber by a said laser diode element by displacing for alignment the rear side edge portion of the ferrule with fulcrum at the sandwiching portion comprising said ferrule supporting part; on the both sides of the ferrule, disposing the ferrule fixing parts that slidably move along the surface of said base in a direction substantially orthogonal to the beam axis of said ferrule, guided by a guide portion provided with a spacing against said ferrule on the both sides for sandwiching the rear side edge portion of the ferrule; adjusting a spacing between the ferrule fixing parts and a side surface of the ferrule to within a range of approximately 0 to 5 $\mu$m; fixedly welding said ferrule fixing parts to said guide portion; and thereafter, fixedly YAG-welding the ferrule fixing parts and the ferrule at a position having said adjusted spacing within a range of approximately 0 to 5 $\mu$m, with said lens formed fiber and said laser diode element re-aligned with each other.

In the present invention provided with the aforementioned configurations, the laser diode element and the lens formed fiber are aligned with each other. Thereafter, the front side edge portion of the ferrule (the edge portion on the side near the laser diode element) on the both sides thereof (the sides of the both side portions) is fixedly sandwiched by means of the ferrule supporting parts (fixing parts).

Here, the fixedly sandwiching method is not limited to a particular one. For example, the sandwiched portion of the ferrule and the ferrule supporting part may be fixedly YAG-welded. Alternatively, as shown in FIG. 2, the ferrule and the ferrule supporting part may be fixed by means of a mechanical configuration. In addition, it is possible to select as appropriate which one of a fixations to give high priority to. Namely, after alignment, either the fixation of the ferrule supporting part and the base, or the fixation of the ferrule supporting part and the ferrule can be selected. The sequence of fixation is not limited to a particular one.

According to the present invention, the ferrule supporting part is provided as a fixing part on the front side edge portion (the ferrule edge portion on the side near the laser diode element) of the ferrule. Then, by a fulcrum at the ferrule sandwiched portion by means of the ferrule supporting part, the rear side edge portion (the side of the ferrule edge portion on the side furthest from the laser diode element) of the ferrule is displaced for alignment. Thereby, the lens formed fiber and the laser diode element are re-aligned with each other. On the both sides for sandwiching the ferrule edge portion on a moving side upon re-alignment, for example, the ferrule fixing parts guided by means of the guide portion provided on the base via a spacing against the ferrule are disposed on the both sides of the ferrule. The spacing between the ferrule fixing parts and a ferrule side surface is adjusted to within a range of approximately 0 to 5 $\mu$m. The ferrule fixing parts are fixedly welded to the guide portion, and thereafter the ferrule fixing parts and the ferrule are fixedly YAG-welded. Accordingly, this allows for substantially eliminating a displacement of the ferrule upon fixedly YAG-welding, thus enabling accurately fixing the ferrule edge portion displaced for re-alignment to a re-alignment position.

That is, even when the rear side edge portion of the ferrule is displaced for re-alignment by a fulcrum at the sandwiched portion of the ferrule, upon fixing the edge portion of the ferrule at this re-alignment position, the fixing position may dislocate from the re-alignment position. This requires further additional final alignment after the fixation at the re-alignment position. In this respect, the present invention allows the fixation to be carried out without a substantial dislocation of the fixing position at said re-alignment position from the re-alignment position. Accordingly, this eliminates the necessity of said final alignment, thereby allowing for shortening the time required for alignment involved in the fabrication of the laser diode module. This in turn allows for fabricating the laser diode module easily in a short time, thereby reducing the cost by that amount.

Furthermore, according to the present invention, unlike the laser diode module shown in the conventional example, the final alignment is not required after the fixation at the re-alignment position. Therefore, this will not cause the rear side edge portion of the ferrule to be displaced a great deal to result in a strain developed due to twisting stress at the sandwiched portion at the time of the final alignment after the fixation at the re-alignment position. For this reason, this allows for preventing cracks from developing at the welded portion of the sandwiched portion after some time of use of the laser diode module. In addition, this also prevents such a problem in that a crack causes the characteristics of the laser diode module to deteriorate, resulting in lowering the reliability.

Still furthermore, according to the present invention, unlike the laser diode module shown in the conventional example, it is not necessary to provide complicated-shaped and expensive parts, used for carrying out the final alignment by means of plastic deformation, which facilitate alignment between the laser diode element and the lens formed fiber, on the rear side edge portion of the ferrule. For this reason, the laser diode module can be provided at a low cost by that amount.

As mentioned above, this allows for providing a laser diode module and the fabricating method therefor, which allows for fabricating the same easily in a short time at a low cost and high reliability.

PREFERRED EMBODIMENTS FOR CARRYING OUT THE INVENTION

Figure 1:
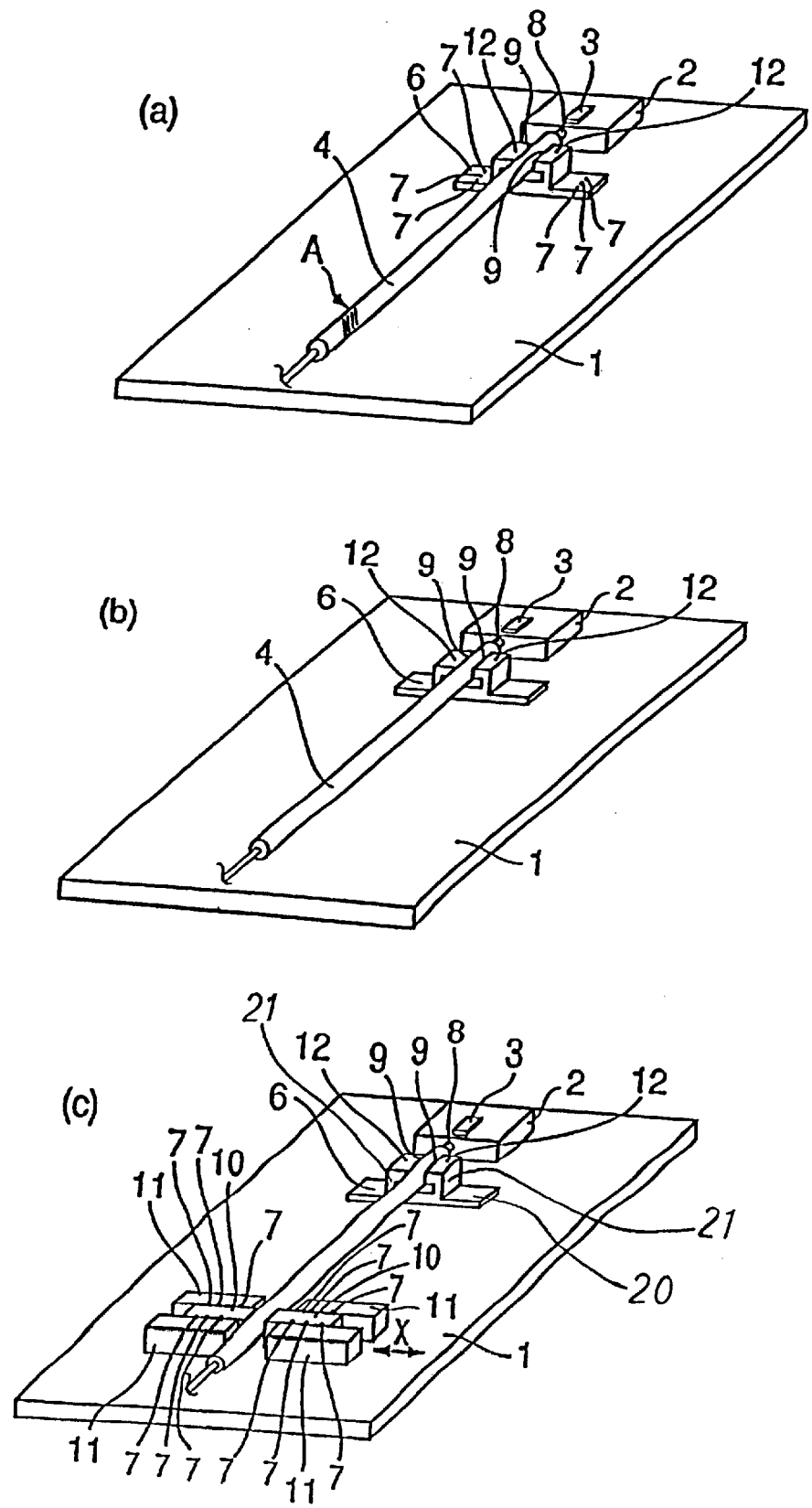
FIG. 1 is a view showing the main structure and the fabricating processes of an embodiment of the laser diode module according to the present invention.

The present invention will be explained in detail with reference to the accompanying drawings. Furthermore, in the explanations of the embodiments hereinafter provided, reference numbers for those elements given to the conventional example will remain the same in the drawings, and explanation for overlapping portions will be omitted or simplified. FIG. 1 shows an embodiment of a laser diode module, according to the present invention, in conjunction with the fabricating method therefor. The laser diode module according to this embodiment is fabricated following the steps of fabrication shown in FIG. 1 (*a*) and (*b*) to be constructed into a structure shown in FIG. 1(*c*).

As shown in FIG. 1(*c*), like the conventional example, the laser diode module, according to this embodiment, has the metallic base 1 with the element mount block 2 provided on the upper side of the base 1 to fix the same. In addition, the laser diode element 3 is fixedly disposed on the element mount block 2.

A lens formed fiber 8 is provided as opposed to the laser diode element 3. The lens formed fiber 8 has a lens (not shown in the figure) formed on the distal end of the optical fiber for receiving laser beams from the laser diode element 3. The lens formed fiber 8 is secured to the ferrule 4 with the distal end thereof protruding through the distal end of a ferrule 4 toward the laser diode element 3. The ferrule 4 is fixed in a manner such that the lens protruding side of the lens formed fiber 8 is opposed to the laser diode element 3. The ferrule 4 is made of metal and formed in a cylindrical shape or in a shape having a U-shaped groove (in FIG. 1, a cylindrically shaped one is shown).

This embodiment features and differs from the prior art example in that this embodiment has a particular structure in which the ferrule 4 is secured to the base 1. This embodiment having the characteristic fixing structure allows for providing more simplified steps than the conventional example for the fabricating process of the laser diode module.

That is, in this embodiment, as shown in FIG. 1(c), the lens formed fiber 8 and the laser diode element 3 are aligned. Under this condition, the front side edge portion of the ferrule 4 (the edge portion of the side near the laser diode element 3) is fixedly sandwiched on the both sides (the both sides of the side faces) thereof by means of the ferrule support part 6. The ferrule supporting part 6 functions as a fixing part for fixing the front side edge portion of the ferrule 4.

The ferrule supporting part 6 is constructed such that a pair of erect walls 21 are erected perpendicularly with respect to a bottom plate 20 mounted on the base 1 and a ferrule supporting portion 12 is extended from upper edges of the pair of erect walls 21 in the horizontal direction toward each other.

On the both sides (the both side faces) for sandwiching the rear side edge portions (the ferrule edge portion furthest from the laser diode element 3) of the ferrule 4, the guide portion 11 is disposed via a spacing between the ferrule 4. A pair of ferrule fixing parts 10, guided by means of the guide portion 11, are adjusted to have a spacing within a range of approximately 0 to 5 $\mu$m to a side surface of the ferrule 4 and then disposed on the both side portions of the ferrule 4. Then, the ferrule fixing parts 10 are fixed to the guide portion 11 and thereafter the ferrule 4 is fixedly YAG-welded to the ferrule fixing parts 10 at a position of said spacing within a range of approximately 0 to 5 $\mu$m. In this example, the ferrule fixing parts 10 are indirectly fixed to the base 1 via the guide portion 11. As a matter of course, the ferrule fixing parts 10 may be fixed directly to the base 1, however, the ferrule fixing parts 10 are preferably fixed to the guide portion 11 to facilitate fixing by welding.

Subsequently, the processes for fabricating the laser diode module of this embodiment. As shown in FIG. 1(a), the ferrule 4 that fixedly supports the lens formed fiber 8 is disposed in between the ferrule supporting portion 12 of the ferrule supporting part 6. At this time, the spacing between the ferrule supporting portion 12 and the ferrule 4 is to be within a range of approximately 0 to 20 $\mu$m. Under this condition, the rear side edge portion (the edge portion of the ferrule 4 on the side furthest from the laser diode element 3) of the ferrule 4 is sandwiched, for example, by means of an alignment jig (not shown). Then, the laser diode element 3 and the lens formed fiber 8 are aligned with each other using the alignment jig. Furthermore, at this time, the ferrule supporting part 6 is adapted to be movable along the surface of the base 1 in conjunction with the ferrule 4.

Then, after said alignment has been completed, the ferrule supporting part 6 is secured to the base 1 at the position of the welded portions 7. Subsequently, the ferrule 4 is fixedly welded to the ferrule supporting portion 12 of the ferrule supporting part 6 having a spacing within a range of approximately 0 to 20 $\mu$m with respect to said ferrule 4 in order to form the sandwiched portion 9. This allows the front side edge portion of the ferrule 4 to be fixedly sandwiched on the both sides thereof by means of the ferrule supporting part 6 and thus to be fixed to the base 1. Furthermore, the ferrule supporting part 6 may be first secured to the base 1. Thereafter, the sandwiched portion 9 may be secured (fixing the ferrule 4 to the ferrule supporting part 6). Alternatively, the procedure may be carried out the other way around. This can be selected as appropriate in accordance with the situation of alignment.

Figure 4:
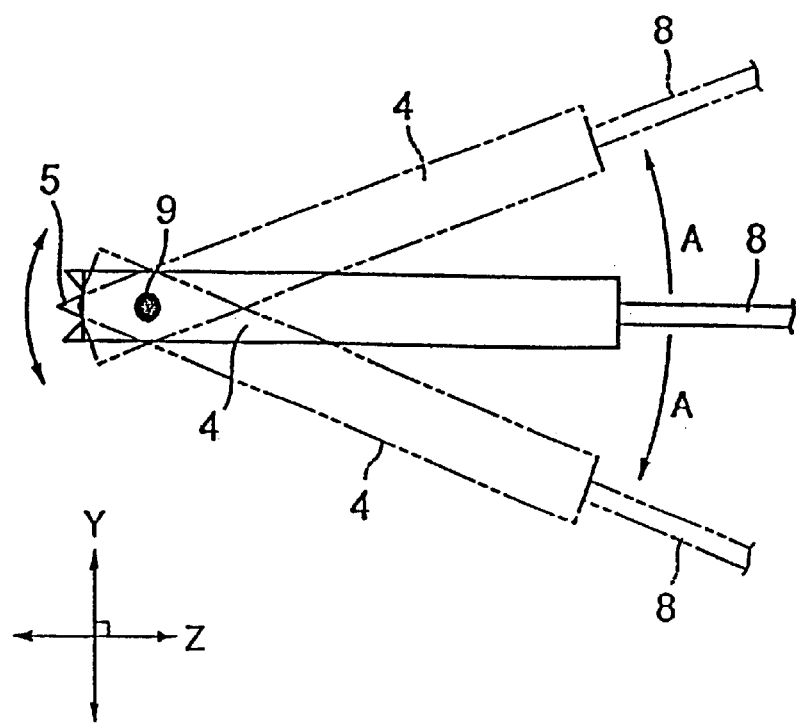
FIG. 4 is an explanatory view showing a tilt of a ferrule, exaggerated for purposes of illustration, in the tilting behavior of the ferrule by a fulcrum at the sandwiched portion.

Thereafter, the ferrule edge portion (such as the portion shown in A of FIG. 1(a)) furthest from the laser diode element 3 is displaced for alignment with fulcrum at the sandwiched portion 9 comprising the ferrule supporting part 6 by said alignment jig, for example, as shown in FIG. 4. Thus, the lens formed fiber 8 and the laser diode element 3 are re-aligned. FIG. 1(b) shows the state of this re-alignment.

Then, as shown in FIG. 1(c), the ferrule fixing parts 10 are quietly disposed on the both sides of the ferrule 4 in such a manner as to be guided by the guide portion 11 that has been secured to the base 1 with a spacing against the ferrule 4 on the both sides for sandwiching the side surfaces of the rear side edge portion of the ferrule. The ferrule fixing parts 10 are to be guided by means of the guide portion 11 and slidably displaced along the surface of the base 1 in the X direction, which is shown in FIG. 1, substantially orthogonal to the beam axis of the ferrule 4. This slidable displacement allows for adjusting the spacing between the ferrule fixing parts 10 on the both sides of the ferrule 4 and the side surfaces of the ferrule 4 to within a range of approximately 0 to 5 $\mu$m. Then, after the ferrule fixing parts 10 have been fixedly welded to the guide portion 11 at a plurality of welded portions 7, the ferrule fixing parts 10 and the ferrule 4 are fixedly YAG-welded at a position adjusted to within said range of approximately 0 to 5 $\mu$m.

Furthermore, said re-alignment is carried out, for example, while a laser beam from the laser diode element 3 is allowed to be incident on the lens formed fiber 8 to propagate therethrough. Accordingly, said re-alignment is carried out so as to obtain the highest intensity of the laser beam propagating through the lens formed fiber 8 by displacing the rear side edge portion of the ferrule 4 for alignment by means of the alignment jig as mentioned above. Furthermore, for example, the ferrule 4 may be displaced for alignment as follows. That is, displacement of the ferrule 4 by a stepping motor may be adjusted manually where the displacement is caused by means of a stepping motor provided on the alignment jig, while an optical intensity detector is monitored which detects the intensity of light that propagates through the lens formed fiber 8 to be transmitted. Alternatively, displacement of the ferrule 4 may be adjusted in a manner such that the ferrule 4 is automatically displaced to an alignment position through control of a computer to which said optical intensity detector and a driving device of the stepping motor are coupled all together.

According to this embodiment, the ferrule fixing parts 10 are disposed with the same guided by means of the guide portion 11, and then the spacing between the ferrule fixing parts 10 and the side portions of the ferrule 4 is adjusted to within a range of approximately 0 to 5 $\mu$m. Thereafter, the ferrule 4 is secured to the ferrule fixing parts 10. This allows the ferrule to be displaced little upon YAG-welding of the ferrule fixing parts 10 and the ferrule 4, providing little dislocation upon fixing the rear side edge portion (the ferrule edge portion on the side for being displaced for re-alignment) of the ferrule 4. Accordingly, fixing the rear side edge portion results in no dislocation in the alignment position between the lens formed fiber 8 and the laser diode element 3, allowing the ferrule 4 to be secured to a re-alignment position with accuracy.

Figure 3:
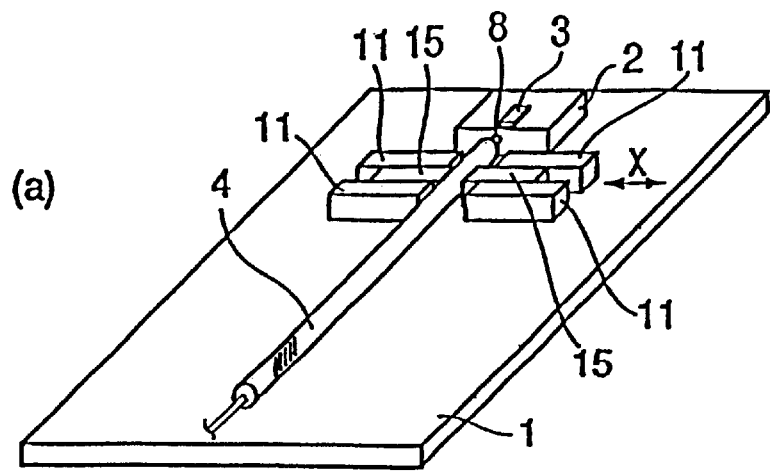
FIG. 3 illustrates a main portion of a conventional laser diode module in conjunction with fabricating processes therefor.
Figure 3:
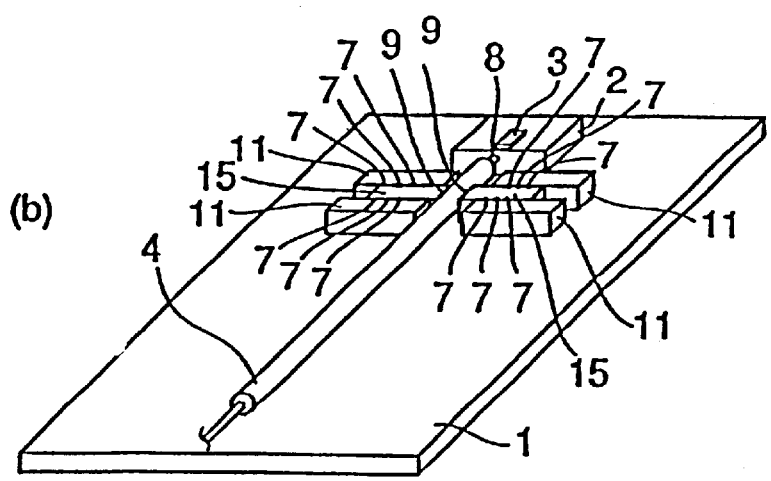
Figure 3:
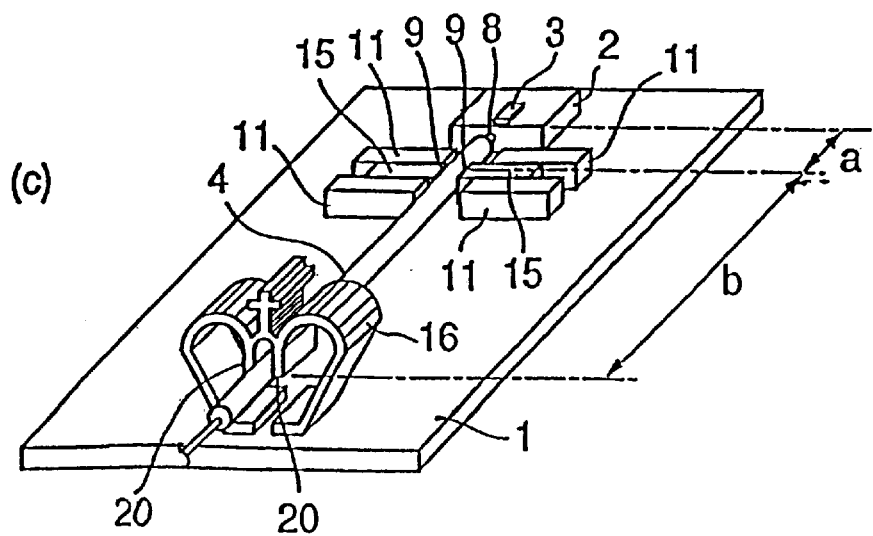

That is, in the case of the conventional example, such a problem would be presented in that the position of the ferrule rear fixing part 16 for fixing the ferrule was dislocated when the ferrule rear fixing part 16 shown in FIG. 3(c) is secured to the base 1. To overcome this problem, re-alignment is carried out by displacing the rear side edge portion of the ferrule 4 by a fulcrum at the sandwiched portion 9, and then the ferrule 4 is secured to the ferrule fixing portion of the ferrule rear fixing part 16 at this re-alignment position. However, the ferrule is dislocated from the re-alignment position. For this reason, in the conventional example, the ferrule rear fixing part 16 requires a plastic deformation for final alignment after having been fixed at the re-alignment position. In this respect, this embodiment allows the fixing position at said re-alignment position to be fixed with substantially no dislocation from the re-alignment position, thus dispensing with said final re-alignment. Therefore, this allows for shortening much of the time for realignment during fabrication of a laser diode module and thus fabricating the laser diode module easily in a short time, thus providing reduced cost by that amount.

Furthermore, according to this embodiment, unlike the conventional example, the final alignment is not required after fixation has been completed at a re-alignment position. Accordingly, it is not necessary to displace the ferrule rear side edge portion by deforming permanently the rear fixing part 16 upon final alignment after the fixation at the re-alignment position, unlike the conventional example. The displacement for the final alignment may cause a strain to develop due to twisting stress or the like at the sandwiched portion 9. Thus, this allows for preventing cracks or the like to develop at the welded portion of the sandwiched portion 9 after some time of use of the laser diode module. Moreover, such a problem in that a crack causes the characteristics of the laser diode module to deteriorate and thus the reliability thereof to reduce can be prevented.

Furthermore, unlike the conventional example, since the rear fixing part 16 is not provided which is complicated in shape and expensive as shown in FIG. 3(c), this embodiment allows for providing a laser diode module with a reduced cost.

Figure 2:
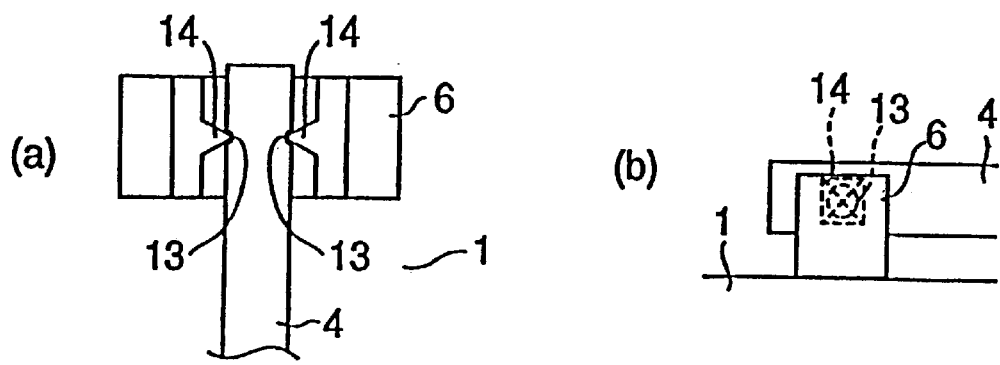
FIG. 2 illustrates the structure of the ferrule that is fixedly sandwiched by means of ferrule supporting parts of another embodiment of a laser diode module according to the present invention, with a plan view shown in FIG. 2(*a*) and a side view shown in FIG. 2(*b*).

Furthermore, the present invention can take various forms of the embodiment, not limited to the aforementioned embodiment. For example, in the aforementioned embodiment, the front side edge portion of the ferrule 4 is sandwiched tightly by means of the ferrule supporting portion 12 of the ferrule supporting part 6 and fixedly welded to form the sandwiched portion 9. However, this sandwiched portion 9 may be configured otherwise. For example, as shown in FIG. 2, a recessed portion 13 may be formed on the side surface of the ferrule 4. A projecting portion 14 with a tapered distal end is provided on the ferrule supporting part 6, corresponding to the recessed portion 13 of the ferrule 4, and protruded toward the recessed portion 13. The projecting portion 14 is allowed to fit in the recessed portion 13 of the ferrule 4. The mechanically fitted portion between the projecting portion 14 and the recessed portion 13, which is not welded, can be taken as the sandwiched portion.

As such, the projecting portion 14 is fit into the recessed portion 13 provided on the ferrule 4 to form the sandwiched portion 9, thereby allowing for fixing the front side edge portion of the ferrule 4 under the point contact condition. Accordingly, the ferrule 4 is allowed to tilt freely by a fulcrum at the distal end of the projecting portion 14 when the laser diode element 3 and the lens formed fiber 8 are re-aligned by a fulcrum at the sandwiched portion 9. This free tilting allows for preventing excessive force from being exerted on the sandwiched portion 9, thereby facilitating said re-alignment more than ever. Furthermore, compared with the case where the ferrule 4 is fixedly welded to the ferrule supporting part 6, cracking at the sandwiched portion 9 can be positively avoided and thus the reliability of the laser diode module can be increased more than ever.

Furthermore, the ferrule supporting part 6 comprises a crimping member whose crimping force is used to crimp-fix the ferrule 4, and this crimping fixed portion may function as the sandwiched portion 9. As such, in the present invention, the method for fixedly sandwiching the front side edge portion of the ferrule 4 is not limited to a particular one but can be set as appropriate, and thus any method can be used for fixedly sandwiching the same. However, it is necessary to make a dislocation in the alignment position of the ferrule 4 as small as possible when the front side edge portion of the ferrule 4 is fixedly sandwiched. For this, with the lens formed fiber 8 and the laser diode element 3 being aligned with each other, a minute spacing within a range of approximately 0 to 20 μm between the ferrule 4 and the fixing part is preferably provided to YAG-welding the minute spacing. Welding the ferrule 4 and the fixing part as spaced as such and kept from contact with each other can substantially eliminate a dislocation of the ferrule 4 upon welding. Moreover, this spacing is minute enough not to cause a decrease in strength of welding and to provide reliability of welding strength.

In addition, the rear side edge portion of the ferrule 4 is fixed according to the same fixing configuration as the aforementioned embodiment. Thereby, the edge portion (the rear side edge portion of the ferrule 4) of the ferrule 4, opposite to the sandwiched portion, can be positively fixed likewise at the re-aligned position without dislocation.

Furthermore, the ferrule 4 is intended to have a cylindrical shape or a shape of a U-shaped groove. However, the shape of the ferrule 4 is not limited to a particular shape. Other shapes may be employed if the shape is stable enough to fixedly support the lens formed fiber 8.

Applicability in Industry

As mentioned above, the laser diode module and the fabricating method, according to the present invention, are suitable for providing a laser diode module with improved yields and thus at a low cost in the fields of optical communications or optical signal processing. Here, the laser diode module has a laser diode element and a lens formed fiber, which are easily and accurately aligned with each other.

What is claimed is:
1. A method for manufacturing a laser diode module, said laser diode module comprising:
 a base having a fixing portion on a principal surface thereof;
 a laser diode element fixedly disposed on the fixing portion;
 a lens formed fiber formed with a lens at a distal end thereof,
 a ferrule having a front side and a rear side, said ferrule for supporting said lens formed fiber,
 a first ferrule fixing part for attaching to the ferrule proximate the front side of the ferrule, said first ferrule fixing part for retaining the ferrule, said first ferrule fixing part fixedly disposed on said principal surface of the base,
 a second ferrule fixing part one of directly and indirectly secured to the principal surface for attaching to the ferrule proximate the rear side of the ferrule and for retaining the ferrule in a fixed position relative to the second fixing part and the base; and,
 a third ferrule fixing part one of directly and indirectly secured to the principal surface for attaching to the ferrule proximate the rear side thereof on an opposing side to the second ferrule fixing part and for retaining the ferrule in a fixed position relative to the third fixing part and the base, said lens disposed opposite to said laser diode element such that said lens formed fiber and said laser diode element are optically coupled to each other; wherein the distal end of the lens formed fiber where said lens is disposed protrudes from the front side of the ferrule, and said base having at least a guide portion for guiding the second and third ferrule fixing parts;

said method comprising the steps of:

aligning the lens formed fiber and the laser diode for good optical coupling therebetween, securing the ferrule proximate the first fixing part to the base such that the ferrule is retained, said first fixing part for acting as a fulcrum between said base and said ferrule;

re-aligning said lens formed fiber with said laser diode element by displacing for alignment the rear side of the ferrule about the fulcrum proximate the first fixing part;

adjusting a spacing between the second and third ferrule fixing parts and a side surface of the ferrule to within a range of approximately 0 to 5 $\mu$m while maintaining engagement of the second and third ferrule fixing parts in the corresponding guide portion of the base;

fixedly welding said second and third ferrule fixing parts to the base; and, fixedly YAG-welding the ferrule fixing parts and the ferrule together absent substantial displacement of the ferrule relative to the base.

2. A method for manufacturing a laser diode module according to claim 1, wherein the step of fixedly welding the ferrule fixing parts and the ferrule together comprises YAG welding the ferrule fixing parts and the ferrule together.

3. A method for manufacturing a laser diode module according to claim 2, wherein the step of aligning the lens formed fiber and the laser diode for a highly efficient optical coupling therebetween involves displacing the ferrule relative to the first ferrule fixing part within a range of approximately 0 to 20 $\mu$m, and, wherein the step of securing the ferrule proximate the first fixing part to the base such that the ferrule is retained comprises the step of fixedly YAG-welding the first ferrule fixing part and the ferrule together absent substantial displacement of the ferrule relative to the base.

4. A method for manufacturing a laser diode module according to claim 2, wherein the step of fixedly welding the second and third ferrule fixing parts to the base comprises fixedly welding the second and third ferrule fixing parts to the at least a guide portion of the base.

\* \* \* \* \*